United States Patent
Yu et al.

(10) Patent No.: US 10,873,009 B2
(45) Date of Patent: Dec. 22, 2020

(54) BARRIER LAYER FUNCTIONED NOVEL-STRUCTURE CERAMIC CONVERTER MATERIALS AND LIGHT EMITTING DEVICES

(71) Applicant: OSRAM Opto Semiconductors GmbH, Regensburg (DE)

(72) Inventors: Zhengbo Yu, Shrewsbury, MA (US); Hiroaki Miyagawa, Andover, MA (US)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 16/198,435

(22) Filed: Nov. 21, 2018

(65) Prior Publication Data

US 2020/0161507 A1    May 21, 2020

(51) Int. Cl.
   *H01L 33/50* (2010.01)

(52) U.S. Cl.
   CPC .......... *H01L 33/502* (2013.01); *H01L 33/505* (2013.01); *H01L 33/507* (2013.01); *H01L 2933/0041* (2013.01)

(58) Field of Classification Search
   CPC .... H01L 33/502; H01L 33/505; H01L 33/507
   See application file for complete search history.

(56) References Cited

U.S. PATENT DOCUMENTS

| | | | | |
|---|---|---|---|---|
| 7,947,992 B2 * | 5/2011 | Yasukawa | ........... | H01L 51/5044 257/89 |
| 8,304,097 B2 * | 11/2012 | Ahn | ............. | H01L 51/5036 313/504 |
| 8,604,689 B2 * | 12/2013 | Ma | ............. | H01L 51/5016 313/504 |
| 8,633,475 B2 * | 1/2014 | Endo | .............. | H01L 51/5044 257/40 |
| 9,102,875 B2 | 8/2015 | Pan et al. | | |
| 10,587,090 B1 * | 3/2020 | Raring | ............ | H01S 5/06825 |
| 2012/0068213 A1 * | 3/2012 | Zhang | ............. | C04B 35/62665 257/98 |
| 2012/0218736 A1 | 8/2012 | Zhang et al. | | |
| 2013/0292728 A1 * | 11/2013 | Ishimori | ............. | H01L 33/502 257/98 |
| 2013/0320384 A1 | 12/2013 | Liepold et al. | | |
| 2014/0326970 A1 * | 11/2014 | Hudson | ............. | H01L 51/0067 257/40 |
| 2015/0140710 A1 * | 5/2015 | McLaurin | ............ | H01S 5/0217 438/31 |
| 2019/0044089 A1 * | 2/2019 | Helander | ............ | H01L 51/0046 |
| 2020/0012022 A1 * | 1/2020 | Lenef | ............... | C09K 11/7734 |
| 2020/0203568 A1 * | 6/2020 | Jang | ............. | H01L 33/32 |

* cited by examiner

*Primary Examiner* — Ida M Soward
(74) *Attorney, Agent, or Firm* — Slater Matsil, LLP

(57) ABSTRACT

A ceramic wavelength converter assembly has a layered structure. The ceramic wavelength converter assembly includes two first layers having an undoped host material, or a doped host material, two second layers having a barrier material and being disposed between the two first layers and a third layer having an undoped host material, or a doped host material and being disposed between the two second layers. The two first layers include the undoped host material and the third layer includes the doped host material, or the two first layers include the doped host material and the third layer includes the undoped host material.

20 Claims, 7 Drawing Sheets

| Structure Examples | Thickness of layers (μm) | | | T. (°C) | Time (hr) | Atmosphere |
| --- | --- | --- | --- | --- | --- | --- |
| | Undoped outer YAG | Al2O3 | Ce-doped middle YAG | | | |
| Examples 1, 5, 9, 13 | 34 | 10 | 14 | 1630-1750 | 1-5 | Wet H2 |
| Examples 2, 6, 10 | 34 | 13 | 14 | | | |
| Examples 3, 7, 11 | 34 | 10 | 25 | | | |
| Examples 4, 8, 12 | 34 | 13 | 25 | | | |

Fig. 3

| Examples | Un-doped outer YAG layer (um) | Al2O3 barrier layer (um) | Ce doped middle YAG layer (um) | Sintering temperature (°C) | Cx | Cy | CE (LPWo-b) |
| --- | --- | --- | --- | --- | --- | --- | --- |
| Example 1 | 34 | 10 | 14 | 1630 | 0.269 | 0.239 | 124.3 |
| Example 2 | 34 | 10 | 25 | 1630 | 0.319 | 0.329 | 139.4 |
| Example 3 | 34 | 13 | 14 | 1630 | 0.280 | 0.261 | 125.9 |
| Example 4 | 34 | 13 | 25 | 1630 | 0.327 | 0.344 | 139.0 |
| Example 5 | 34 | 10 | 14 | 1650 | 0.262 | 0.226 | 122.0 |
| Example 6 | 34 | 10 | 25 | 1650 | 0.309 | 0.311 | 138.9 |
| Example 7 | 34 | 13 | 14 | 1650 | 0.273 | 0.246 | 125.6 |
| Example 8 | 34 | 13 | 25 | 1650 | 0.318 | 0.327 | 137.3 |
| Example 9 | 34 | 10 | 14 | 1700 | 0.254 | 0.214 | 122.4 |
| Example 10 | 34 | 10 | 25 | 1700 | 0.298 | 0.295 | 138.0 |
| Example 11 | 34 | 13 | 14 | 1700 | 0.262 | 0.228 | 126.9 |
| Example 12 | 34 | 13 | 25 | 1700 | 0.308 | 0.312 | 141.1 |
| Example 13 | 34 | 10 | 14 | 1750 | 0.264 | 0.237 | 126.6 |

Fig. 4

BARRIER LAYER FUNCTIONED NOVEL-STRUCTURE CERAMIC CONVERTER MATERIALS AND LIGHT EMITTING DEVICES

TECHNICAL FIELD

This invention relates to ceramic wavelength converter assemblies and light emitting devices comprising ceramic wavelength converter assemblies.

BACKGROUND

LED (light emitting diode) based on phosphors often combines a blue light emitting InGaN chip with a yellow oxide converter such as YAG:Ce(Gd) phosphor/ceramics for the compromise of cost, efficiency and CRI (color rendering index). Currently, for white light LEDs, ceramic converters often used are YAG:Ce (Gd) ceramics for high internal quantum efficiency (IQE) and high lumens. YAG:Ce (Gd) ceramic converters currently used are normally doped with Gd (from 1 to 20 at. %) for color steering. Its cubic crystal structure and high diffusion coefficient impart easier densification at reasonable temperatures and provide the advantage to achieve high transparency.

However, with the ever-increasing demands on applications at elevated temperatures with increased operating current of high-power LED, YAG:Ce phosphor doped with Gd demonstrated a thermal quenching problem of reduced brightness at elevated temperatures (i.e. >110° C.).

Different potential methods to improve the thermal quenching performance of ceramic converters apart from the efforts on the design of package have been proposed, such as (1) reducing the doping level of Gd as a dopant or even totally eliminating it; and/or (2) using higher thermal conductive materials as a matrix in the form of composites, such as YAG:Ce phosphor in $Al_2O_3$, AlN etc. Of these composite ceramic converter materials, YAG:Ce phosphor in $Al_2O_3$ matrix is of the most interest, simply because both are oxides and have a very good physical and thermal compatibility at reasonable processing/operation ranges. YAG:Ce (Gd) usually has a thermal conductivity of 5-9 W $m^{-1}$ $K^{-1}$ whereas $Al_2O_3$ has a higher thermal conductivity of about 22-39 W $m^{-1}K^{-1}$ at room temperature depending on the sample conditions.

Completely eliminating Gd from YAG:Ce(Gd) phosphor will improve the thermal quenching significantly, however, it also requires to change the current ceramic converter dimension especially in thickness significantly in order to achieve the same color desired in single phase form; e.g. from 120 μm to about 30 μm or below, which is too thin for normal production procedure to handle. Therefore reducing the amount of Gd doping in YAG:Ce phosphor/ceramics seems a compromised method with a compromised performance.

Using a phosphor material, such as YAG:Ce in $Al_2O_3$ as matrix can improve the thermal conductivity. On the other hand, it results in low forward and in-line transmission because of its non-cubic crystal structure causing bi-infringe effect combined with the residual pores, and the difference of refractive indices between YAG and $Al_2O_3$ etc., all these cause excessive light scattering which in turn significantly reduce the in-line transmission, and hence affect the light output. To increase sintering temperature, to prolong sintering dwelling time, or to introduce small amount of liquid phase can improve translucency of composite materials with an $Al_2O_3$ matrix, but it will cause decrease in IQE (internal quantum efficiency) because of the potential chemical incompatibility (reactions, defects etc.). Spark plasma sintering (SPS) and hot isostatic pressing (HIP) have also been applied to reinforce the densification of the composite materials. However, these methods result in darkening issues because of the furnace lining materials at high temperature and reducing atmosphere etc., hence reducing the IQE significantly to an unacceptable value for commercialization.

U.S. Pat. No. 9,102,875 describes emissive ceramic materials having a Ce-dopant concentration gradient and methods of making and using the same.

SUMMARY

It is an object of the invention to obviate the disadvantages of the prior art.

It is another object of the invention to provide a ceramic wavelength converter assembly that might be used in LED applications.

It is a further object of the invention to provide a light emitting device comprising at least one ceramic wavelength converter assembly of the present invention.

It is a further object of the invention to provide a method for producing a ceramic wavelength converter assembly of the present invention.

In accordance with one object of the invention, there is provided a ceramic wavelength converter assembly having a layered structure, comprising two first layers comprising an undoped host material, or a doped host material, two second layers comprising a barrier material and being disposed between the two first layers, and a third layer comprising a doped host material, or an undoped host material and being disposed between the two second layers, wherein the two first layers comprise the undoped host material and the third layer comprises the doped host material, or wherein the two first layers comprise the doped host material and the third layer comprises the undoped host material.

In accordance with another object of the present invention, there is provided a light emitting device comprising: a light-emitting structure that emits a primary light having a first peak wavelength and a ceramic wavelength converter assembly positioned to receive the primary light from the light-emitting diode, the ceramic wavelength converter comprising two first layers comprising an undoped host material, or a doped host material, two second layers comprising a barrier material and being disposed between the two first layers, and one third layer comprising a doped host material, or an undoped host material and being disposed between the two second layers, wherein the two first layers comprise the undoped host material and the third layer comprises the doped host material, or wherein the two first layers comprise the doped host material and the third layer comprises the undoped host material.

In accordance with another object of the present invention, there is provided a method for producing a ceramic wavelength converter assembly having a layered structure comprising: providing a third layer comprising a doped host material, or an undoped host material; applying a second layer comprising a barrier material on the upper side of the third layer and applying a second layer comprising a barrier material on the lower side of the third layer; applying first layers comprising an undoped host material, or a doped host material on each of the sides of the second layers opposite to the sides being in contact with the third layer. The two first layers comprise the undoped host material and the third layer comprises the doped host material, or the two first layers comprise the doped host material and the third layer comprises the undoped host material.

BRIEF DESCRIPTION OF THE DRAWINGS

FIG. 2, which includes

FIG. 3 is a table showing examples of ceramic wavelength converter assemblies of different configurations, i.e. different thicknesses of the layers, different sinter temperatures and sinter times.

FIG. 4 is a table showing optical data obtained at room temperatures for different examples of ceramic wavelength converter assemblies.

DETAILED DESCRIPTION OF ILLUSTRATIVE EMBODIMENTS

Figure 1:
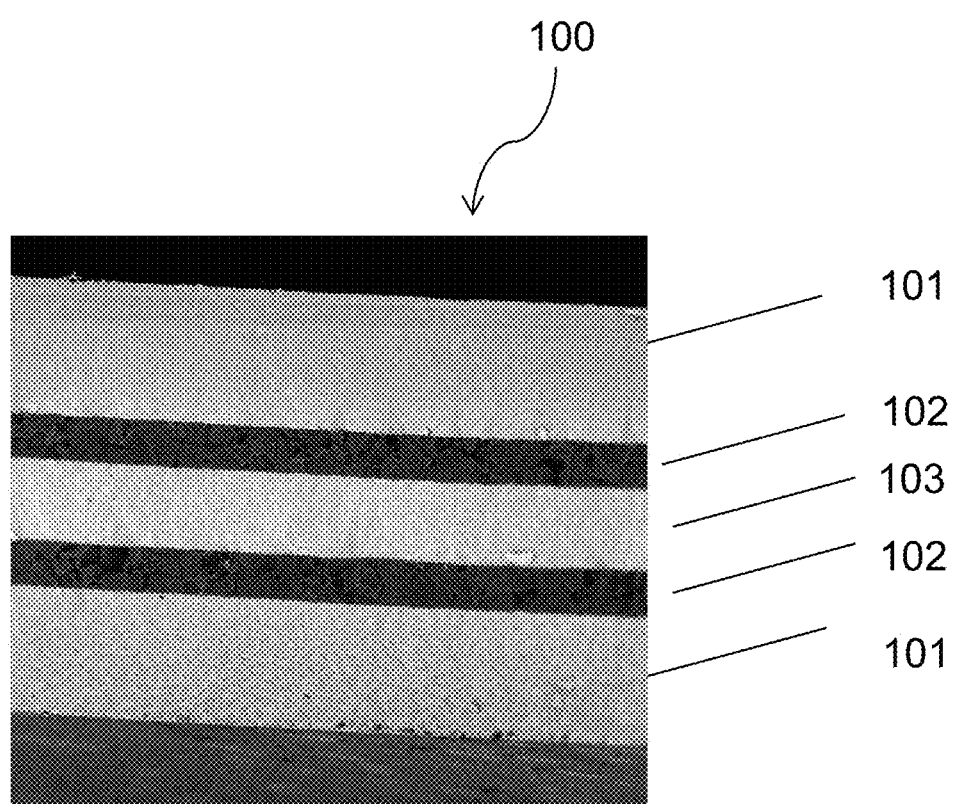
FIG. 1 is a SEM image of a ceramic wavelength converter assembly.
Figure 2A:
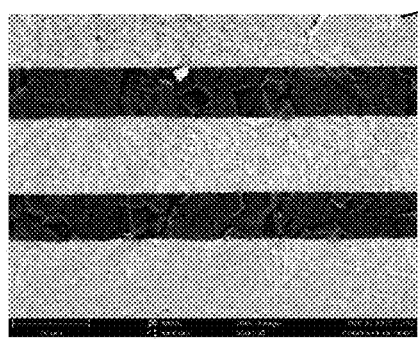
FIGS. 2A-2D, shows SEM images of four ceramic wavelength converter assemblies.
Figure 2B:
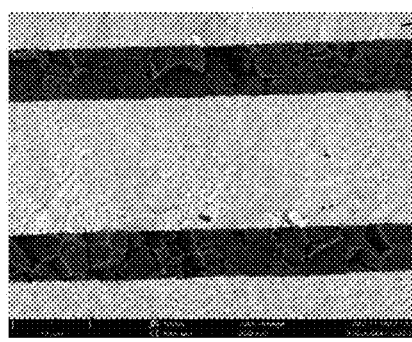
Figure 2C:
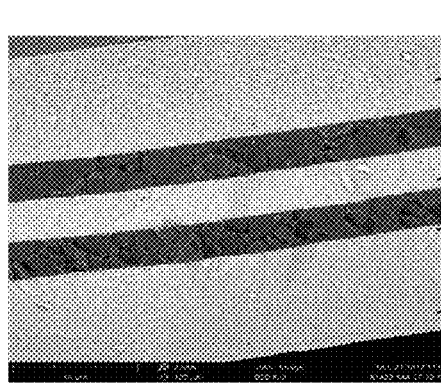
Figure 2D:
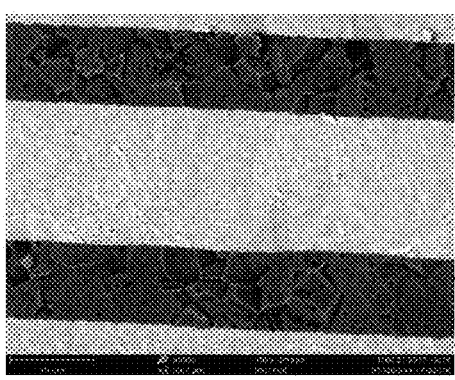

For a better understanding of the present invention, together with other and further objects, advantages and capabilities thereof, reference is made to the following disclosure and appended claims taken in conjunction with the above-described drawings.

References to the color of the phosphor, LED, or conversion material refer generally to its emission color unless otherwise specified. Thus, a blue LED emits a blue light, a yellow phosphor emits a yellow light and so on.

The present invention is directed to a ceramic wavelength converter assembly having a layered structure, comprising two first layers comprising an undoped host material, or a doped host material, two second layers comprising a barrier material and being disposed between the two first layers, and a third layer comprising a doped host material, or an undoped host material and being disposed between the two second layers, wherein the two first layers comprise the undoped host material and the third layer comprises the doped host material, or wherein the two first layers comprise the doped host material and the third layer comprises the undoped host material.

In an embodiment, the two first layers comprise a doped host material and the third layer comprises an undoped host material.

In an alternative embodiment, the two first layers comprise an undoped host material and the third layer comprises a doped host material.

As used herein a wavelength converter is a solid structure that converts at least part of the light of a certain first wavelength to light of a certain second wavelength. An assembly is the composite of different materials. In general a ceramic wavelength converter assembly is a composite of different materials comprising at least one ceramic material to convert at least part of the light of a certain first wavelength to light of a certain second wavelength.

The ceramic wavelength converter assembly of the present invention has a layered structure, which can also be understood as a sandwich-structure.

According to the present invention, a host material is an inorganic crystalline or polycrystalline material. Typical host materials are oxides, nitrides and oxynitrides, sulfides, selenides, halides or silicates of zinc, cadmium, manganese, aluminum, silicon, or various rare-earth metals. A doped host material is an inorganic crystalline or polycrystalline material that comprises an element, i.e. a dopant, in the crystalline or polycrystalline material. An undoped host material is a host material that does not comprise any dopant, i.e. less than 0.01 at %, preferably less than 0.001 at % of the dopant in the host material, more preferably 0 at % of the dopant in the host material.

According to the present invention, a doped host material is a phosphor. A phosphor is a material that converts light of a certain first wavelength to light of a certain second wavelength.

The ceramic wavelength converter assembly comprises two first layers comprising an undoped host material e.g. undoped YAG (yttrium-aluminum-garnet), or a doped host material (e.g. doped YAG). In an embodiment, the first layers may comprise sub-layers, e.g. a first layer may comprise two, three, four or more layers, so-called sub-layers.

In an embodiment, the ceramic wavelength converter assembly with a layered structure comprises the combination of undoped and doped YAG in the first layers and the third layer. In a further embodiment, the ceramic wavelength converter assembly with a layered structure comprises the combination of doped YAG with different doping levels in atomic percent in the first layers and the third layer.

First wavelengths according to the present invention are wavelengths between 300 nm to 570 nm. In an embodiment the first wavelengths are between 350 nm to 500 nm. In a further embodiment the first wavelengths are between 420 nm to 480 nm.

Structures that can produce light of a first wavelength are, e.g., InGaN or GaN chips, or solid state laser diodes.

Second wavelengths according to the present invention are wavelengths between 350 nm to 800 nm. In an embodiment the second wavelengths are between 380 nm to 750 nm. In a further embodiment the second wavelengths are between 400 nm to 700 nm. In another embodiment, light of the second wavelength is white light.

In an embodiment the phosphors are inorganic compounds. Exemplary phosphors are garnets, oxynitridosilicates, perovskits, quantum dots, silicates or combinations thereof, each doped with at least one appropriate element. A preferred phosphor is doped garnet, wherein the dopant is Ce.

The phosphors may be doped with different activators, i.e., dopants. Doping in the context of phosphors means the introduction of impurities (dopants) in the crystal structure of the host material. Dopants may be metal ions, such as $Ce^{3+}$, $Gd^{3+}$, $Eu^{2+}$, wherein $Ce^{3+}$ is preferred depending on applications. The amount of dopants in the crystal structure may vary in a broad range. Typical amounts of dopants are 0.01 at % up to 20 at %. The amounts of dopants depend on optical properties of the final product such as color point, thermal quenching, and color temperature etc.

Exemplary doped phosphors are YAG:Ce, YAG:Ce (Gd), LuAG:Ce, LuAG:Ce(Gd), $SrSi_2O_2N_2$:Eu, SiAlON:Eu etc.

In an embodiment YAG:Ce may be doped with at least 4% of Gd. In alternative embodiments YAG:Ce may be doped with at least 6% of Gd.

In an embodiment, the amount of the dopants in the ceramic wavelength converter assembly is at least 0.8 at %.

In a further embodiment, the difference between the amount of the dopant in the layer(s) with the doped host material and the layer(s) with the undoped host material is at least 0.7 at %.

The third layer can be also understood as central or middle layer of the assembly. The third layer may comprise more than one layer. In an embodiment, the third layer may comprise two, three, four or more layers, so-called sub-layers. The third layer may comprise the undoped host material, or the doped host material.

In an embodiment, one of the first layers and the third layer is doped and the other(s) is/are undoped. In other words, the first layers may comprise doped host materials and the third layer comprises undoped host material. In an aspect of this embodiment, the doped and the undoped host material is derived from the same compound class. E.g. the first and third layers comprise garnet, such as YAG for the undoped host material and YAG:Ce for the doped host material.

In an alternative embodiment, the first layers may comprise undoped host material and the third layer comprises doped host material. In an aspect of this embodiment, the doped and the undoped host material is derived from the same compound class. E.g. the first and third layers comprise garnet compounds, such as YAG for the undoped host material and YAG:Ce (Gd) for the doped host material.

In an alternative embodiment, the first and third layers may both comprise doped host material but with different doping levels. In an aspect of this embodiment, the both doped host materials are derived from the same compound class. E.g. the first and third layers comprise garnet compounds.

Further examples of undoped host material and doped host material pairs are of the same compound class e.g. the two first layers are completely undoped such as YAG, and the third layer is doped with Ce such as YAG:Ce.

In an embodiment the first and/or third layers are made completely out of the host material. In this embodiment, the host material is in the form of a crystal, or in the form of a sintered ceramic material. The sintered ceramic material might further comprise a sinter aid.

In an embodiment the host materials are a mixture of different host materials.

In a further embodiment, the host materials are particles, platelets, or elongated crystals embedded in a matrix material. The matrix material might be oxides. An exemplary embodiment of the matrix material is $Al_2O_3$.

In an embodiment each of the first layers has a thickness of 0.1 µm to 100 µm. In a preferred embodiment each of the first layers has a thickness of 1 µm to 50 µm. In a more preferred embodiment each of the first layers has a thickness of 3 µm to 40 µm. In an aspect of the embodiment, each of the first layers has the same thickness. In an alternative aspect of the embodiment, each of the first layers has a different thickness.

In an embodiment the third layer has a thickness of 0.1 µm to 100 µm. In a preferred embodiment the third layer has a thickness of 1 µm to 50 µm. In a more preferred embodiment the third layer has a thickness of 3 µm to 30 µm. In an aspect of the embodiment, the third layer comprises more than one layer, wherein each of the layers has the same thickness. In an aspect of the embodiment, the third layer comprises more than one layer, wherein each of the layers has a different thickness.

The ceramic wavelength converter assembly having a layered structure comprises also two second layers comprising a barrier material, and being disposed between the two first layers. In an embodiment, the second layers completely separate the first layers from each other. In a further embodiment, the second layers completely separate the first layers from the third layer.

In the context of the present invention, a barrier material, which preferably cannot form a crystal with a dopant, is a material that prevents at least partially or completely the imparting of the dopant from the layer(s) comprising the doped host material to the layer(s) comprising the undoped host materials.

The second layers act as barrier layers. The barrier layers, advantageously prevent completely or at least partially, the imparting of the dopant from the first to the third layers or from the third to the first layers. In an embodiment, the barrier layers comprise the barrier material. In an alternative embodiment, the barrier layers consist of the barrier material.

In an embodiment, the second layers comprise or constitute of a transparent or highly translucent material, i.e. the incoming light can pass through without or nearly without any omission of light. In an embodiment, the second layers comprise or constitute of an inorganic material. In an embodiment, the second layers comprise or constitute of a metal oxide.

Exemplary materials of second layers are $Al_2O_3$, $SiO_2$, or $MgAl_2O_4$ etc.

In an embodiment, the second layers comprise $Al_2O_3$. In an embodiment, the second layers constitute of $Al_2O_3$.

In an embodiment, each of the second layers comprise or constitute of the same material. In an alternative embodiment, each of the second layers comprise or constitute of different materials.

In an embodiment, the second layers may comprise sub-layers, e.g. a second layer may comprise two, three, four or more layers, so-called sub-layers.

In an embodiment each of the second layers has a thickness of 0.1 µm to 100 µm. In a preferred embodiment each of the second layers has a thickness of 1 µm to 50 µm. In a more preferred embodiment each of the second layers has a thickness of 3 µm to 20 µm. The thickness is preferably chosen in this way to prevent the diffusion of the dopant from the layer(s) with the doped host material to the layer(s) with the undoped host material.

In an embodiment the ceramic wavelength converter assembly comprises more layers. In an aspect of this embodiment, each of the first layers might comprise 2 layers, 3 layers, 4 layers or even more layers. In an aspect of this embodiment, the first layers are undoped host material layers. In an alternative aspect the first layers are doped host material layers. In a further aspect of this embodiment the first layers each comprise different doped host materials that allow the conversion of light of a certain first wavelength to a second wavelength. With the use of different conversion materials, the adjustment of the color of the emitted light is possible.

In a further embodiment, the third layer of the ceramic wavelength converter assembly comprises 2 layers, 3 layers, 4 layers or even more layers. In an aspect of this embodiment, the third layers are undoped host material layers. In an alternative aspect the third layers are doped host material layers. In a further aspect of this embodiment the third layers each comprise different doped host materials that allow the conversion of light of a certain first wavelength to a second wavelength. With the use of different conversion materials, the adjustment of the color of the emitted light is possible. In an aspect of this embodiment, the ceramic wavelength converter assembly comprises undoped first layers and doped third layers. In an alternative aspect of this embodiment, the ceramic wavelength converter assembly comprises doped first layers and undoped third layers.

A further object of the present invention is a light emitting device comprising: a light-emitting structure (light emitting mean) that emits a primary light having a first peak wavelength and a ceramic wavelength converter assembly positioned to receive the primary light from the light-emitting structure, the ceramic wavelength converter comprising two first layers comprising an undoped host material, or a doped host material, two second layers comprising a barrier material and being disposed between the two first layers, and a third layer comprising a doped host material, or an undoped host material and being disposed between the two second layers, wherein the two first layers comprise the undoped host material and the third layer comprises the doped host material, or wherein the two first layers comprise the doped host material and the third layer comprises the undoped host material.

The light-emitting structure, the ceramic wavelength converter assembly, the first layers, the second layers and the third layer, the barrier material as well as the phosphor material may correspond to the respective means and materials as described above.

In an embodiment, the barrier material of the light emitting device is selected from the group consisting of $Al_2O_3$, $SiO_2$, $MgAl_2O_4$ etc. In a preferred embodiment, the barrier material of the light emitting device is $Al_2O_3$.

In an embodiment, the phosphor of the light emitting device is selected from the group consisting of garnet, LuAG:Ce (Gd) etc. In a preferred embodiment, the phosphor of the light emitting device is YAG:Ce.

In a further embodiment of the light emitting device, the first layers are undoped YAG. In a further embodiment of the light emitting device the doped host material is YAG:Ce.

In an embodiment of the light emitting device, the first layers consist of YAG. In a further embodiment of the light emitting device, the first layers consist of YAG:Ce.

In an embodiment of the light emitting device, the third layer consists of YAG. In a further embodiment of the light emitting device, the third layer consists of YAG:Ce.

In an embodiment of the light emitting device, the first layers consist of undoped host material (e.g. YAG) and the third layer consists of doped host material (e.g. YAG:Ce). In an alternative embodiment of the light emitting device, the first layers consist of doped host material (e.g. YAG:Ce) and the third layer consists of undoped host material (e.g. YAG). In an aspect of these embodiments, the second layers acting as barrier layers consist of a metal oxide (e.g. $Al_2O_3$).

In some embodiments the light emitting devices are coated with at least one layer of $SiO_2$, $Al_2O_3$, or a combination thereof.

The ceramic wavelength converter assembly might be useful in any light emitting device known to the person skilled in the art. The light emitting devices comprising the ceramic wavelength converter assemblies, or light emitting devices of the present invention are useful in various applications. Exemplary applications of the light emitting devices are in automotive industry, in household appliances, in general lighting.

A further object of the present invention is a method for producing a ceramic wavelength converter assembly having a layered structure comprising: providing a third layer comprising a doped host material, or an undoped host material; applying a second layer comprising a barrier material on the upper side of the third layer and applying a second layer comprising a barrier material on the lower side of the third layer; applying first layers comprising an undoped host material, or a doped host material on each of the sides of the second layers opposite to the sides being in contact with the third layer. The two first layers comprise the undoped host material and the third layer comprises the doped host material, or the two first layers comprise the doped host material and the third layer comprises the undoped host material.

In an alternative embodiment, the present invention provides a method for producing a ceramic wavelength converter assembly having a layered structure that includes top and bottom first layers, top and bottom second layers and a third layer. The method comprises forming the bottom second layer on an upper side of the bottom first layer; forming the third layer on an upper side of the bottom second layer; forming the top second layer on an upper side of the third layer; and forming the top first layer on an upper side of the top second layer. The top and bottom second layers comprise barrier layers. The top and bottom first layers comprise an undoped host material and the third layer comprises a doped host material, or the top and bottom first layers comprise the doped host material and the third layer comprises the undoped host material.

The ceramic wavelength converter, the first layers, the second layers and the third layer, the barrier material as well as the host materials may correspond to the respective means and materials as described above.

The application of the layers may be carried out by a conventional tape cast process consisting of the procedures like tape-casting, blanking, lamination, punch etc. processes.

FIG. 1 shows an SEM image of a ceramic converter assembly 100 of the present invention. The ceramic converter assembly 100 has a thickness of 60 μm to 300 μm, in a preferred embodiment from 90 μm to 250 μm. In a preferred embodiment, the ceramic converter assembly 100 has a platen-like shape, although it is not limited to that. The ceramic converter assembly 100 of FIG. 1 shows the layered structure, which can also be characterized as sandwich structure.

The ceramic converter assembly 100 comprises two first layers 101 of an undoped YAG. The thickness of the first layers lot shown in FIG. 11 is about 35 μm. In the center of the ceramic converter assembly 100 is a Ce-doped YAG third layer 103. The thickness of the third layer 103 is about 14 μm. The third layer 103 may also be doped with 0.1 at % to 20 at % of Gd. The ceramic converter assembly 100 further comprises two second layers 102, which act as barrier layers. The second layers 102 each have a thickness of about 12 μm, in a preferred embodiment they have a thickness of 5 μm to 10 μm. Due to the small thickness of the second layers 102, undesirable or excessive scattering can be avoided.

The thickness of the second layers 102 is chosen as to just eliminate the diffusion of the dopant from the doped layer(s) to the undoped layer(s). Therefore a high forward transmission at a desirable level can also be obtained. The second layers 102 may consist of $Al_2O_3$. In a preferred embodiment, the second layers 102 completely separate the third layer 103 from the first layers lot. In a further embodiment, the third layer 103 is the undoped YAG layer and the first layers lot are the doped YAG (either doped with $Ce^{3+}$ or $Gd^{3+}$ or their combination layers.

The configuration which is presented in FIG. 1 allows reduced Gd doping or even completely eliminating Gd doping which imparts the materials with excellent thermal quenching at elevated temperatures (e.g. about 4% higher in brightness at 110° C. than YAG:Ce doped with 15% Gd). The thin $Al_2O_3$ layers serving as barrier layers to prevent Ce diffusion from the central YAG:Ce layer to the undoped YAG layers at sintering temperatures to keep the color steering simplified, while at the same time to improve the thermal conductivity, and allow the undoped YAG layers to achieve a high transparency with least scattering. By combination of different thicknesses of the different layers, the scattering behavior of the sandwich structured ceramic materials can be tailored to the desirable level which generates the highest brightness at both room and elevated temperatures. Therefore this invention improves the brightness at both room temperature (25° C.) and elevated temperature (e.g. up to 150° C.), and even provides a solution to applications at high power intensity where high flux/power intensity applied.

The separation of the third layer 103 from the two first layers 101 allows the complete elimination of doping from the layer with the doped host material to the layer with the undoped host material. In exemplary embodiments with YAG:Ce(Gd) as doped host material, the layer with the doped host material can be reduced in thickness. In these embodiments the total thickness of the ceramic wavelength converter assembly can be made up by the adjustment of the combinations of the second layers and the layer(s) with the undoped host material. These exemplary embodiments can be made with a conventional tape cast process.

The complete elimination of the $Gd^{3+}$ doping, either in the first layers 101 or third layer 103 will also impart the highest thermal quenching performance of the materials at elevated temperatures, even at 150° C. The application of second layers 102 not only serves as a barrier layer to prevent the dopant diffusion from the layer(s) with the doped host material to the layer(s) with the undoped host material. The introduction of the second layers 102 can also improve the thermal conductivity of the ceramic converter assembly, hence improve the thermal performance. The application of both second layers 102 and layer(s) with undoped host material not only offers the means to adjust the thickness of the total thickness of the sandwich ceramic converter assembly but also provide the means to tailor the scattering of the sandwich parts for the highest brightness with engineered forward scattering. The sandwich-like structured ceramic converter currently offers a cost effective way which is comparable to the current large scale production method.

FIGS. 2A-2D show SEM images of four examples A, B, C and D, respectively, of ceramic wavelength converter assemblies 200 of the present invention. "A" represents samples of examples 1, 5, 9 and 13, "B" represent samples of example 2, 6, and 10, "C" represents samples of examples 3, 7, and 11, and "D" represents samples of 4, 8 and 12. 201 represents in each of the images the first layers. 202 represents in each of the images the second layers. 203 represents in each of the images the third layers.

The thicknesses of the layers, the configurations, the sinter temperatures, the sinter times and the sinter atmosphere for examples A, B, C and D are given in FIG. 3 and FIG. 4. The layer thicknesses were measured within ±3 µm variations.

FIG. 4. shows data for Examples 1 to 12, ceramic wavelength converter assembly with layered structures of four different configurations of FIG. 2 and FIG. 3 were sintered at different temperatures e.g. 1630° C., 1650° C. and 1700° C., 1750° C. Selected ceramic wavelength converter assemblies were assembled into Oslon Black Flat (OBF) package with $TiO_2$ cast (chip wavelength about 449 nm). Chromaticity data (Cx, Cy), optical performance—brightness (lumens) of examples 1 to 12 was obtained using in-house designed sphere.

Figure 5:
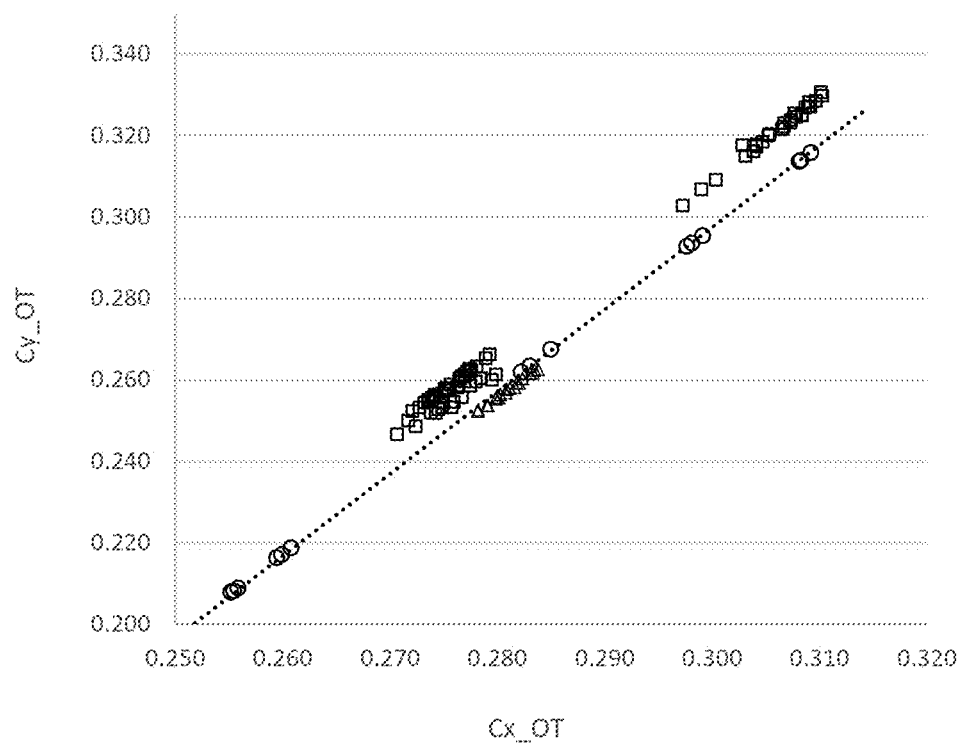
FIG. 5 shows the conversion line shift of ceramic wavelength converter assemblies comprising undoped YAG layers, a YAG layer doped with Ce with and without the presence of $Al_2O_3$ second layers.

FIG. 5 shows the conversions (Cx, Cy) color point (triangle mark) of ceramic wavelengths converter assemblies with a third layer of YAG doped with 2% Ce fit the target reference conversion line (dotted line).

The circle mark (o) with a dotted line refers to a targeted reference phosphor. The triangle mark (Δ) refers to the conversion line (Cx, Cy) of a ceramic wavelength converter assembly comprising two second layers of $Al_2O_3$ of 24 µm, showing a conversion of the light on or close to the conversion line of the target reference phosphor. This represents that there is no diffusion of the Ce dopant from the doped layer into the undoped YAG layer (or the diffusion is too low to be detected). The square mark (□) refers to the conversion line (Cx, Cy) of a ceramic wavelength converter without a barrier layer of $Al_2O_3$ showing conversion shifted into the green caused by the Ce diffusion into the undoped YAG. The ceramic converters with layered sandwich structure were sintered at 1630° C., 1650° C. and 1680° C. for 1 hour. The data were obtained with an in-house tester.

Figure 6:
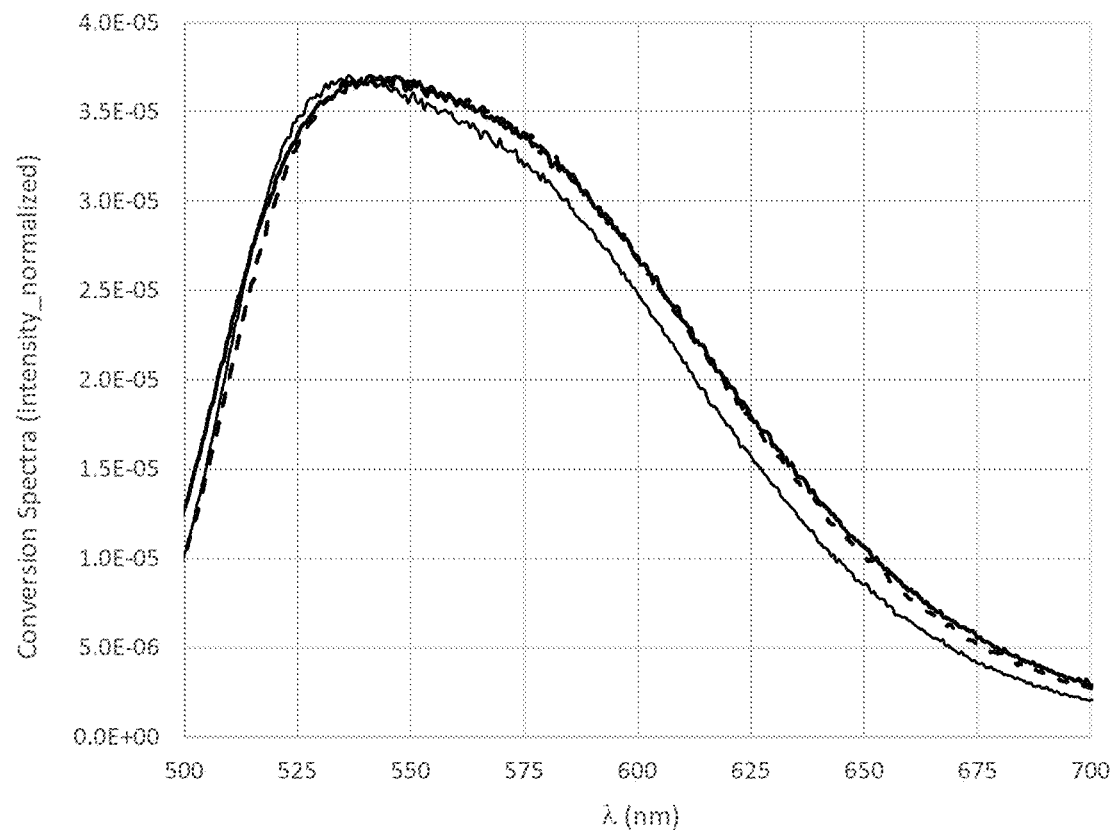
FIG. 6 shows the emission spectra of ceramic wavelength converter assemblies comprising undoped YAG layers, a YAG layer doped with Ce with and without the presence of $Al_2O_3$ second layers.

FIG. 6 shows the conversion spectra of ceramic wavelength converter assemblies with and without second layers of $Al_2O_3$ that act as a barrier layer. The dotted line represents the spectra of a conversion wavelength converter assembly with second layers of $Al_2O_3$, the fine solid line represents the spectra of a conversion wavelength converter assembly without second layers of $Al_2O_3$ against target spectral (coarse solid line). The data in FIG. 6 further confirms the conversion line shift caused by the diffusion of $Ce^{3+}$ from the doped layer to the undoped layer when no $Al_2O_3$ layer is present.

Figure 7:
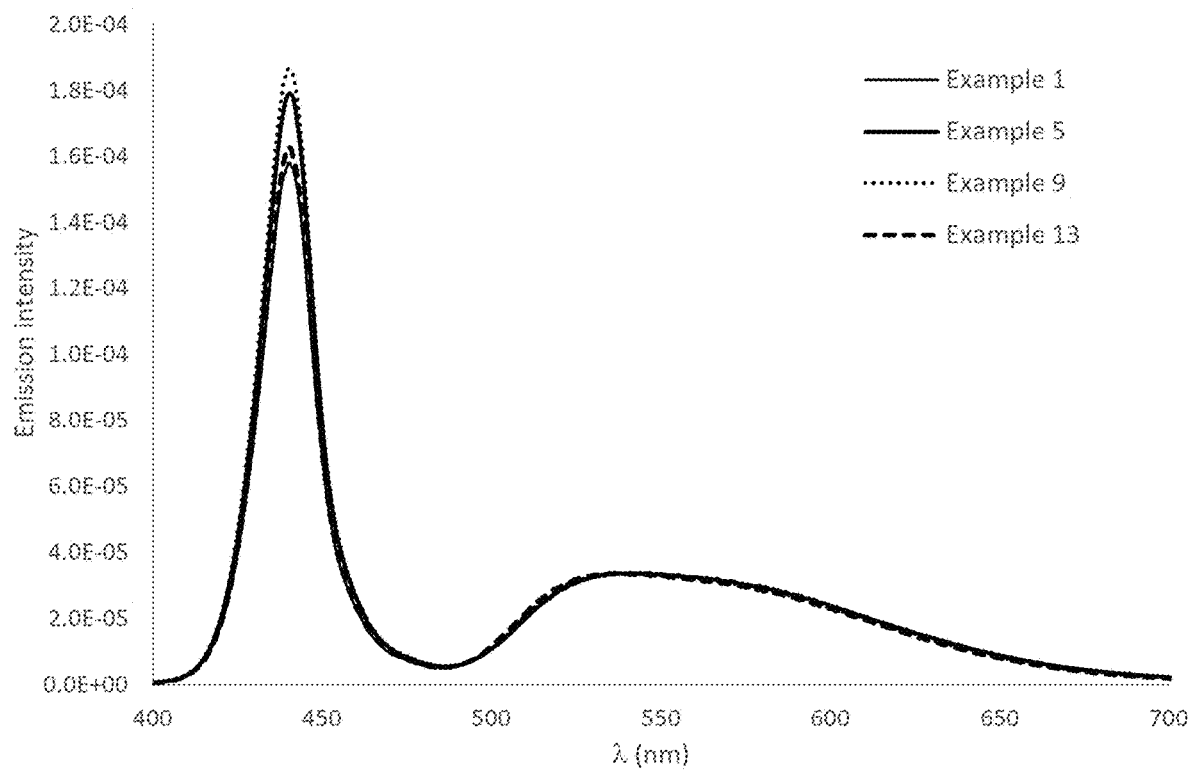
FIG. 7 shows the emission spectra of Example 1 (sintering temperature of 1630° C.), Example 5 (sintering temperature of 1650° C.), Example 9 (sintering temperature of 1700° C.) and Example 13 (sintering temperature of 1750° C.).
Figure 8:
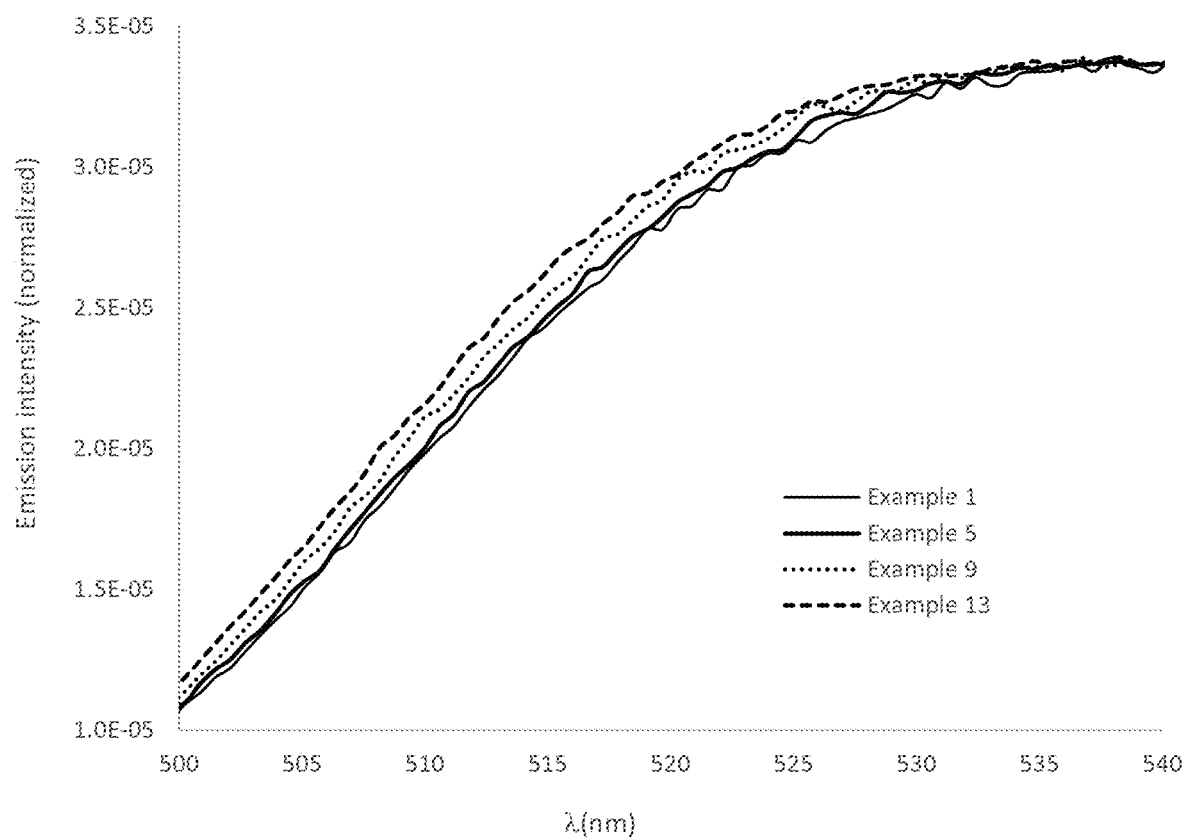
FIG. 8 shows the emission spectra of Examples 1, 5, 9 and 13 and a blue green shift with an increase of the sintering temperature.

FIGS. 7 and 8 show the emission spectra of Examples 1, 5, 9 and 13. Depending on the temperature, the emitted wavelength and the emission intensity are influenced slightly.

EXAMPLES

Starting powders:
YAG:Ce phosphor (for central layer, i.e., third layer)
YAG:Ce (Gd) phosphor for central layer can be obtained in two ways as below:
Pre-synthesized before sintering
Phase: cubic crystal phase >95% (or less than 5 vol. % if any Gd-rich phase present)
Ce doping level: 0.05%-6%, preferred level 0.1%-4%
Particle size: $d_{50}$ 0.01 µm-50 µm, and $d_{90} \leq 30$ µm, preferred $d_{50}$ ca. 01 µm-20 µm and $d_{90} \leq 25$ µm
Sinterability: highly active and sinterable
In-situ synthesized during sintering by mixed-oxide approach
Oxides such as $Y_2O_3$, $Al_2O_3$, $CeO_2$, and $Gd_2O_3$ (if any) were weighed in the weight proportion according to the YAG:Ce (Gd if any) formulation as desired; e.g., $(Y_xGd_y Ce_{(1-x-y)})3Al_5O_{12}$, where $x+y<1$; $0.7 \leq x<1$; $0 \leq y<0.3$,
$Al_2O_3$ powders (for barrier layer, i.e. second layers)
Phase: $Al_2O_3$ with no second phase, >99.5 wt % pure.

Particle size: $d_{50}$ 0.01 µm-5 µm, and $d_{90} \leq 10$ µm, preferred $d_{50}$ ca. 0.01 µm-1 µm and $d_{90} \leq 3$ µm Sinterability: highly active and sinterable $Y_2O_3$ powders (for undoped layer)

Phase: $Y_2O_3$ with no detectable second phase, >99.5 wt % pure.

Particle size: $d_{50}$ 0.01 µm-5 µm, and $d_{90} \leq 10 \leq$ µm, preferred $d_{50}$ ca. 0.01 µm-1 µm and $d_{90} \leq 3$ µm Sinterability: highly active and sinterable In an embodiment, the sandwich-like structured ceramic wavelength converter assembly consists of five layers with three main components as described above. In the final materials after sintering the layer thickness were controlled as below:

YAG:Ce phosphor central or middle layer with or without Gd, thickness ranges from 1 µm to 100 µm, preferably from 3 µm to 50 µm, and more preferably from 5 µm to 40 µm.

Thin $Al_2O_3$ barrier layers, which cover the both sides of the central YAG:Ce phosphor layer. The thickness of $Al_2O_3$ barrier layer ranges from 0.1 µm to 50 µm, preferably from 2 µm to 40 µm, more preferably from 4 µm to 20 µm.

Undoped YAG layers, the outmost two layers—undoped transparent YAG layers. The thickness ranges from 0.5 µm to 200 µm, preferably from 2 µm to 100 µm, more preferably from 10 µm to 50 µm.

The ceramic wavelength converter assembly can be made by various conventions process, such as die pressing, cold isostatic pressing (CIP), tape cast, hot pressing (HP), hot isostatic pressing (HIP) etc. as forming and/or sintering processes.

However a preferred forming process is by conventional tape casting, i.e. by laminating the different layers of different compositions and thickness as designed followed by the punching, prefiring, and sintering. The desired shape for a sintered ceramic wavelength converter assembly may be typically about 1 mm×1 mm square with a thickness of 30 to 2000 microns. The size could be as small as 0.5 mm square for smaller light emitting devices.

Densification can be achieved by either SPS, pressureless sintering (PIS) or other sintering methods such as HIP or GPS etc. The preferred sintering technique selected is pressureless sintering. The main characteristic of pressureless sintering (PLS) is its simplicity which easily allows a large scale production to be implemented.

In an embodiment, the ceramic wavelength converter assembly is placed on an alumina setter/plate which is then placed in an air atmosphere furnace and heated using a typical time-temperature cycle of:

250° C. to 4000° C. in 4 hours
400° C. to 1150° C. in 4 hours
Hold at 1150° C. for a period of from 0.5 to 2 hours
Cool to 25° C. in 3 hours This thermal process removes all of the organic and carbonaceous species including the organic binders used to hold the powders together as well as the pore-forming additive materials if any added according to product requirements. The hold temperature at 1150° C. is also high enough to allow the powder particles to stick together giving the parts sufficient strength to be handled for downstream process. The pore-forming additives are burnt out leaving voids that replicate their sizes and shapes. The pre-fired ceramic plates are transferred onto molybdenum plates and are sintered in a reducing atmosphere such $H_2$, $H_2/N_2$, CO, or mixtures thereof are either in dry or in controlled wet, sintered at 1500-1825° C. for a period of from 1 minute to 2 hours at peak temperature. During the hydrogen sintering, the plates shrink as the ceramic powders sinter and the matrix porosity is removed. If the initial powder particle sizes and mixing/milling conditions are performed properly and no pore-forming additives are added to the batch, the porosity of sandwich structured ceramic converter materials will be reduced at elevated sintering temperatures to a level that the part exhibits a high degree of transparency or translucency.

While there have been shown and described what are at present considered to be preferred embodiments of the invention, it will be apparent to those skilled in the art that various changes and modifications can be made herein without departing from the scope of the invention as defined by the appended claims. The disclosure rather comprises any new feature as well as any combination of features, which in particular includes any combination of features in the appended claims, even if the feature or combination is not per se explicitly indicated in the claims or the examples.

What is claimed is:

1. A ceramic wavelength converter assembly having a layered structure, the ceramic wavelength converter assembly comprising:
    two first layers comprising an undoped host material, or a doped host material;
    two second layers comprising a barrier material and being disposed between the two first layers; and
    a third layer comprising an undoped host material, or a doped host material and being disposed between the two second layers,
    wherein the two first layers comprise the undoped host material when the third layer comprises the doped host material, or
    wherein the two first layers comprise the doped host material when the third layer comprises the undoped host material.

2. The ceramic wavelength converter assembly of claim 1, wherein the two first layers comprise the undoped host material and the third layer comprises the doped host material.

3. The ceramic wavelength converter assembly of claim 1, wherein the doped host material is a phosphor.

4. The ceramic wavelength converter assembly of claim 1, wherein the barrier material is $Al_2O_3$.

5. The ceramic wavelength converter assembly of claim 1, wherein the undoped host material comprises a material selected from the group consisting of garnet, $MgAl_2O_4$, silicates, oxynitrides and nitrides.

6. The ceramic wavelength converter assembly of claim 1, wherein the undoped host material is garnet.

7. The ceramic wavelength converter assembly of claim 1, wherein the doped host material is doped with Ce, or Gd, or a combination thereof.

8. The ceramic wavelength converter assembly of claim 1, wherein the doped host material is doped with Ce.

9. The ceramic wavelength converter assembly of claim 1, wherein the doped host material is doped with at least one dopant in an amount of at least 0.8 at %.

10. The ceramic wavelength converter assembly of claim 1, wherein the doped host material is YAG:Ce.

11. The ceramic wavelength converter assembly of claim 1, wherein the undoped host material is YAG and the doped host material is YAG:Ce.

12. The ceramic wavelength converter assembly of claim 1, wherein the undoped host material is $MgAl_2O_4$.

13. The ceramic wavelength converter assembly of claim 1, wherein the undoped host material comprises silicates.

14. The ceramic wavelength converter assembly of claim 1, wherein the undoped host material comprises oxynitrides or nitrides.

15. A light emitting device comprising:
- a light-emitting structure configured to emit a primary light having a first peak wavelength; and
- a ceramic wavelength converter assembly configured to receive the primary light from the light-emitting structure, the ceramic wavelength converter assembly comprising:
  - two first layers comprising an undoped host material, or a doped host material;
  - two second layers comprising a barrier material and being disposed between the two first layers; and
  - a third layer comprising a doped host material, or an undoped host material and being disposed between the two second layers,
  - wherein the two first layers comprise the undoped host material when the third layer comprises the doped host material, or
  - wherein the two first layers comprise the doped host material when the third layer comprises the undoped host material.

16. The light emitting device of claim 15, wherein the barrier material is $Al_2O_3$.

17. The light emitting device of claim 15, wherein the undoped host material comprises a material selected from the group consisting of garnet, $MgAl_2O_4$, silicates, oxynitrides and nitrides.

18. The light emitting device of claim 15, wherein the undoped host material is YAG.

19. The light emitting device of claim 15, wherein the doped host material is YAG:Ce.

20. The light emitting device of claim 15, wherein the undoped host material is YAG and the doped host material is YAG:Ce.

* * * * *